United States Patent
Koerzdoerfer et al.

(10) Patent No.: US 11,639,978 B2
(45) Date of Patent: May 2, 2023

(54) MAGNETIC RESONANCE FINGERPRINTING METHOD AND APPARATUS

(71) Applicant: Siemens Healthcare GmbH, Erlangen (DE)

(72) Inventors: Gregor Koerzdoerfer, Erlangen (DE); Mathias Nittka, Baiersdorf (DE); Jianing Pang, Chicago, IL (US); Peter Speier, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/448,757

(22) Filed: Jun. 21, 2019

(65) Prior Publication Data

US 2019/0391220 A1  Dec. 26, 2019

Related U.S. Application Data

(60) Provisional application No. 62/688,013, filed on Jun. 21, 2018.

(51) Int. Cl.
*G01R 33/48* (2006.01)
*G01R 33/56* (2006.01)
*G01R 33/50* (2006.01)

(52) U.S. Cl.
CPC ......... *G01R 33/4828* (2013.01); *G01R 33/50* (2013.01); *G01R 33/5608* (2013.01)

(58) Field of Classification Search
CPC ............ G01R 33/5608; G01R 33/4828; G01R 33/561; G01R 33/50; G01R 33/443; G01R 33/385; G01R 33/54; A61B 5/055
See application file for complete search history.

(56) References Cited

U.S. PATENT DOCUMENTS 10,921,406 B2 *  2/2021  Nittka ..................... G01R 33/50
2015/0301141 A1 * 10/2015  Griswold ........... G01R 33/5608
                                                        382/131

(Continued)

OTHER PUBLICATIONS

Jiang, Yun et al. "MR Fingerprinting Using Fast Imaging with Steady State Precession (FISP) with Spiral Readout" Magnetic Resonance in Medicine, vol. 74, pp. 1621-1631, 2015 // DOI: 10.1002/mrm.25559.

(Continued)

*Primary Examiner* — Rishi R Patel
(74) *Attorney, Agent, or Firm* — Banner & Witcoff Ltd.

(57) ABSTRACT

In a method and apparatus for determining parameter values in voxels of an examination object using magnetic resonance fingerprinting (MRF), a first signal comparison is made of signal characteristics of established voxel time series with first comparison signal characteristics. Further synthetic comparison signal characteristics are generated from the first comparison signal characteristics and values determined in the first signal comparison. The generated further comparison signal characteristics are used to perform a further signal comparison, with which values of at least a first and a second further parameter are determined. From the further comparison signal characteristics, a value of at least one further parameter is determined that could not necessarily already be determined in the first signal comparison.

14 Claims, 3 Drawing Sheets

(56) References Cited

U.S. PATENT DOCUMENTS

| | | | |
|---|---|---|---|
| 2016/0061922 A1 | 3/2016 | Grodzki et al. | |
| 2016/0299206 A1* | 10/2016 | Cohen | G01R 33/54 |
| 2018/0074148 A1* | 3/2018 | Pfeuffer | G01R 33/546 |
| 2019/0285712 A1* | 9/2019 | Gulani | G01R 33/56308 |
| 2019/0340463 A1 | 11/2019 | Nittka et al. | |
| 2019/0383892 A1* | 12/2019 | Nittka | G01R 33/5608 |
| 2021/0109180 A1* | 4/2021 | Boernert | A61B 5/055 |

OTHER PUBLICATIONS

Ma, Dan et al. "Magnetic Resonance Fingerprinting" Nature, vol. 495, No. 7440, pp. 187-192, 2013 // doi:10.1038/nature11971.

Wang, Charlie Yi et al. "In vivo Simultaneous Measurement δf, T1, T2, and T2* by Magnetic Resonance Fingerprinting with Quadratic RF Phase" Proc. Intl. Soc. Mag. Reson. Med. (ISMRM); abstract #3960; Workshop on MR Fingerprinting Cleveland 2017.

Assländer, Jakob et al. "Pseudo Steady-State Free Precession for MR-Fingerprinting" Magnetic Resonance in Medicine (2016) // DOI: 10.1002/mrm.26202.

Chiu, Su-Chin et al. "Effects of RF pulse profile and intra-voxel phase dispersion on MR fingerprinting with balanced SSFP readout" Magnetic Resonance Imaging, vol. 41, pp. 80-86, 2017 // DOI: 10.1016/j.mri.2017.04.002.

* cited by examiner

MAGNETIC RESONANCE FINGERPRINTING METHOD AND APPARATUS

RELATED APPLICATION

The present application claims the benefit of the filing date of Non-Provisional Application Ser. No. 62/688,013, filed on Jun. 21, 2018, the content of which is incorporated herein by reference.

BACKGROUND OF THE INVENTION

Field of the Invention

The invention concerns a magnetic resonance (MR) fingerprinting method for improved determination of local parameter values of an examination object, as well as an MR apparatus, and a non-transitory data storage medium that implement such a method.

Description of the Prior Art

Magnetic resonance is a known modality with which images of the interior of an examination object can be generated. Simply explained, the examination object is for this purpose positioned in a magnetic resonance scanner, in a relatively strong, static, homogeneous basic magnetic field, also called the $B_0$ field, with field strengths of 0.2 tesla to 7 tesla and above, such that the nuclear spins thereof are oriented in the direction of the basic magnetic field. In order to trigger nuclear spin resonance, the examination object is irradiated with radio-frequency excitation pulses (RF pulses). The triggered nuclear spin resonance is detected as so-called k-space data, on the basis of which MR images are reconstructed, or spectroscopic data are identified. For the purpose of spatially encoding of the measurement data, rapidly switched magnetic gradient fields are overlaid on the basic magnetic field, which define the trajectories along which the measurement data are entered into k-space. The captured measurement data are digitized and stored as complex numerical values in a k-space matrix. An associated MR image can be reconstructed, for example by a multidimensional Fourier transform, from the k-space matrix that is populated with such values. A series of RF pulses to be emitted, gradients to be activated, and read-out procedures that is used for this purpose, ordered in a particular manner, is designated as a sequence.

Various sequence types are known, with different levels of sensitivity to parameters that describe the materials in an examined examination object (e.g. longitudinal relaxation T1, transverse relaxation T2 and proton density). MR images that are reconstructed from measurement data captured using a particular sequence type represent mapping of the examination object in a manner that is weighted depending on the sensitivities of the sequence type used.

Magnetic resonance imaging created using a magnetic resonance system can serve to determine the presence and/or distribution of a material in an examination object. The material may be, for example, a (possibly pathological) tissue of the examination object, a contrast agent, a marking substance, or a metabolic product.

Information about the materials present may be obtained from the captured measurement data in a wide variety of ways. A relatively simple source of information is the image data reconstructed from the measurement data. However, there are also more complex methods that identify information about the examined examination object, for example from a voxel time series of image data reconstructed from successively measured sets of measurement data.

With the use of quantitative MR imaging techniques, absolute properties of the measured object can be determined—for instance in the case of a person the tissue-specific T1 and T2 relaxation. In contrast thereto, the conventional sequences that are usually used in the clinical routine generate only a relative signal intensity for different tissue types (so-called weightings), with the result that the diagnostic interpretation is highly dependent on the subjective assessment made by the radiologist. Quantitative techniques thus provide the clear advantage of being objectively comparable, but because of their long measurement times are hardly used in the current routine.

Relatively new quantitative measuring methods, such as magnetic resonance fingerprinting methods (MRF methods), can bring this disadvantage of long measurement times down to an acceptable level. In MRF methods, signal characteristics of image data that have been reconstructed from measurement data captured successively with different capture parameters are considered for each voxel or at least voxels of interest in the image data, as voxel time series, wherein the signal characteristic of a voxel time series is considered as a "fingerprint" of the parameters that prevail in the voxel location of the examination object during measurement. These signal characteristics are compared, using pattern recognition methods, with signal characteristics in a previously identified database of signal characteristics that are characteristic of certain materials (the so-called "dictionary"), in order to identify the materials that are represented in the image data reconstructed from the measurement data, or the spatial distribution of tissue-specific parameters (such as the transverse relaxation T2 or longitudinal relaxation T1—so-called T1 and T2 cards), in the mapped examination object. The signal characteristics in a dictionary of this kind may in this case also be generated by simulations.

The principle of this method is thus to compare measured signal characteristics with a plurality of previously known signal characteristics. Here, signal characteristics for different combinations of T1 and T2 relaxation times and other parameters may be identified for the dictionary. For each parameter to be determined, there is a respective "dimension" of the dictionary, as it is called, in which different parameter values of the respective parameter are included in order to make different comparison values available. The parameter values, such as T1 and T2 times, of a voxel (which may be a pixel or voxel) in the image are then determined in particular by comparing the measured signal characteristic with all or some of the simulated signal characteristics. This procedure is called "matching". The signal characteristic in the dictionary that is closest to the measured signal characteristic determines the parameters, such as relaxation parameters T1 and T2, of the respective voxel.

In addition to the transverse relaxation T2, also called spin-spin relaxation, the effective transverse relaxation T2*, which is shorter than the transverse relaxation T2, is also known. The effective transverse relaxation T2* additionally takes account of local variations in the basic magnetic field B0, and thus of off-resonance effects, which result in faster decay of transverse magnetization. The relationship between the two transverse relaxation parameters T2 and T2* can be expressed as follows:

$$\frac{1}{T2*} = \frac{1}{T2} + \frac{1}{T2'}$$

where T2' is the decay of transverse magnetization caused by local variations in the basic magnetic field B0, and hence decay of the transverse magnetization by phase dispersion.

In principle, in addition to the tissue-specific parameters of an examined object that are mentioned above, it is also possible to identify measurement—specific parameters, such as field strengths of the applied magnetic fields, or indeed the local distribution of the strength of the radiated radio-frequency field B1+, since signals captured by MR techniques may depend on the tissue-specific parameters in an investigated object and on measurement-specific parameters that describe the conditions prevailing during measurement. The capture parameters used are in this case selected such that the measurement data captured displays a dependence on the desired parameters to be determined. For example, sequence types that are sensitive to the desired parameters may be used for the MRF method. As a result of the dependences and the variation in the capture parameters and the account taken thereof in the comparison signal characteristics, the desired parameters may be determined from voxel time series that have been captured in this way.

For MRF methods, in principle any echo technique may be utilized in combination with any of the methods for k-space scanning (filling) (e.g. Cartesian, spiral, radial).

An MRF method that takes into account the tissue-specific parameters T1 and T2 in the dictionary used and that determines them in measured voxel time series is for example described in the article by Ma et al.: "Magnetic Resonance Fingerprinting", Nature, 495: pages 187-192 (2013). There, a sequence based on TrueFISP (true fast imaging with steady-state free precession) is utilized in combination with spiral k-space scanning. US 20160061922 A1 describes a further MRF method.

In principle, any effects that are not taken into account in the comparison signal characteristics in the dictionary, for example because they are not in the signal model from which a dictionary was generated, but which have an influence on the signals captured when the voxel time series are generated, may falsify the results of an MRF experiment, that is to say the parameter values determined. Depending on the sequence used when generating the voxel time series, this effect may be more or less pronounced.

An effect of this kind in MR experiments (MR measurements) that may have an influence on signals measured in a voxel time series is for example signal decay as a result of off resonances, and hence as a result of the phase dispersion within a voxel. The influence of this effect is conventionally quantified, as described above, by a further relaxation time, the effective transverse relaxation T2*. In order to identify differences in the phase dispersion for each voxel within an object, it is possible, for example in order to generate the voxel time series, to use sequences whereof the signal response depends on T2*. Since T2* is assumed to be an exponential decay (for example with the further assumption of a Gaussian distribution of the off resonances within the voxel), it is possible to scan this signal decay for example using multi-echo FLASH sequences dependent on T2*. Using voxel time series that are captured in this way, and corresponding comparison signal characteristics dependent on T2*, the parameter of the T2* time can be determined by a signal comparison that is conventional in MRF methods.

If the possible effect of a parameter, such as the phase dispersion (also called intra-voxel dephasing), is not taken into account, as is the case, for example, in the cited article by Ma et al., this may falsify the results of determining the values of other parameters as well. For example, in the article by Chiu et al.: "Effects of RF pulse profile and intra-voxel phase dispersion on MR fingerprinting with balanced SSFP readout", *Magnetic Resonance Imaging* 41, pages 80-86, 2017, a dependence of MRF results based on an MRF implementation in the cited article by Ma et al. on an intra-voxel phase dispersion is described.

In order to reduce this dependence, the article by Assländer et al.: "Pseudo Steady-State Free Precession for MR Fingerprinting", Magnetic Resonance in Medicine 77, pages 1151-1161, 2017 presents an MRF implementation that is intended to reduce the said sensitivity to intra-voxel dephasing by adapting the sequences used in the generation of the voxel time series.

For the purpose of generating the voxel time series, other MRF implementations use sequences in which, although such effects of intra-voxel dephasing occur, they are relatively small. Examples are the MRF implementation described by Jiang et al. in the article "MR Fingerprinting Using Fast Imaging with Steady State Precession (FISP) with Spiral Readout", Magnetic Resonance in Medicine 74, pages 1621-1631, 2015, in which a FISP (fast imaging with steady-state precession) sequence is used, or MRF implementations that use FLASH (fast low-angle shot) sequences. With these sequence types, in each repetition time TR, transverse magnetization is completely destroyed ("spoiling"). As a result, the effect of phase dispersion is limited to faster signal decay. In this way, for example by keeping the echo time TE constant over the course of the sequence, it is also possible to keep the influence of phase dispersion constant, as a result of which the MRF results are subject to at most a low level of falsification.

In the article by Wang et al.: "In vivo Simultaneous Measurement of $\delta_f$, T1, T2 and T2* by Magnetic Resonance Fingerprinting with Quadratic RF Phase", Proc. Intl. Soc. Mag. Reson. Med. 25, page 3960, 2017, a further MRF method is described in which a phase dispersion is assigned to each voxel in a type of matching. There, after determining the parameter values for T1, T2 and B0 ($\delta_f$), the phase dispersion is determined in a further matching step. For the further matching step, signals from the dictionary in the B0 dimension are weighted, using a Lorentz distribution of different widths which is centered about the value determined for B0, and summed. Using the further matching step with the signals obtained thereby, a "best fit" width is identified, and this is used as the measure for the phase dispersion. In the further matching step, the already determined parameter values for T1, T2 and B0 are retained, with only the phase dispersion (over the entire width) being determined.

SUMMARY OF THE INVENTION

An object of the invention is to enable improved determination of parameter values using MRF methods.

A method according to the invention for determining parameter values in voxels of an examination object using a magnetic resonance fingerprinting (MRF) technique includes the following steps.

A computer provided with an MRF image data composed of voxels. At least one voxel time series is formed by the computer, from which a respective value (P, P') of at least one parameter at the location in the examination object represented by the respective voxel is to be determined.

A first signal comparison is performed by the computer, of at least one segment of the respective signal characteristic of the established voxel time series with a corresponding segment of first comparison signal characteristics, in order to determine the respective values of at least a first one of the parameters to be determined.

The computer generates further comparison signal characteristics on the basis of the first comparison signal characteristics and values determined in the first signal comparison.

The computer performs a further signal comparison of at least one segment of the respective signal characteristic of the established voxel time series with a corresponding segment of the generated further comparison signal characteristics, in order to determine respectively (independently) the values of at least a first and a second further parameter of the parameters to be determined.

The values determined for the respective voxel of the parameters to be determined are then provided as an output from the computer.

By inventively generating further comparison signal characteristics from a provided set of comparison signal characteristics using parameter values that have been determined in a first signal comparison, it is possible to determine a value of at least one further parameter that could not necessarily already be determined in the first signal comparison. Thus, in particular a second further parameter whereof the value is determined in a further signal comparison may not have been determinable in the first signal comparison. This not only increases the number of determinable parameters but at the same time enables the processing power in the further signal comparison to be kept small, since the further comparison signal characteristics do not require an "actual" further dimension in order to determine the further parameters but, so to speak, synthetically convert a dimension of the parameter that was determined in the first signal comparison into a dimension of a further, other parameter. The further (simulated) comparison signal characteristics that are generated form a type of sub-dictionary, which avoids an "actual" additional parameter dimension (for the further parameter) and thus considerably reduces the processing power by comparison with using such an "actual" further parameter dimension.

By determining a first and a second further parameter in the course of the further signal comparison, the method enables the values of at least these two further parameters to be integrally determined, as a result of which falsification of the values of the one parameter by effects caused in accordance with the values of the other parameter can be avoided. This is primarily particularly useful if a second further parameter has an influence on a first further parameter.

During a first signal comparison, the value of the local basic magnetic field can be determined and, as the first and second further parameters, for example the parameters of transverse relaxation T2 and a parameter that is dependent on the phase dispersion prevailing in the respective voxel, for example the phase dispersion itself, can be selected, as a result of which falsification of the determined values of transverse relaxation T2 by effects of the phase dispersion can be avoided. Because a thus determined value of the phase dispersion in a voxel can be associated with a susceptibility of the tissue represented in the voxel, the determination of the phase dispersion values can also be used to provide answers to diagnostic questions.

During the first signal comparison, the value of the longitudinal relaxation T1 or the value of the transverse relaxation T2 can also be determined, and a first further parameter may be the longitudinal relaxation T1 or transverse relaxation T2, and a second further parameter may be a ratio between the longitudinal and transverse relaxation.

By determining the prevailing ratios of longitudinal and transverse relaxation using the further signal comparison, it is possible in particular to avoid so-called "partial volume" effects.

In this way, the method described enables different sequence types with different dependences on different parameters to be used as freely as possible. This makes it possible to determine as precisely as possible the values of as many different parameters as possible using an MRF method, without having to accept falsifications of certain parameter values as a result of the effects of other parameters that have an influence, because of the sequence types used, on the signals captured when the voxel time series are generated, and without excessively increasing the processing power.

Here, values determined during a first signal comparison of parameters that display no dependence on a second further parameter can be "kept" during the further signal comparison, that is to say they are not determined again. Because the absence of the said dependence means that no influence on the values determined in the first signal comparison need be expected, in this way the processing power can once again be kept economically low.

A magnetic resonance apparatus according to the invention has a scanner with a basic field magnet, a gradient unit, a radio-frequency unit, and a control computer that operates the scanner and is configured to perform the method according to the invention, with a parameter value determining processor thereof, as described above.

The present invention also encompasses a non-transitory, computer-readable data storage medium encoded with programming instructions that, when the storage medium is loaded into a stand-alone computer, or a computer that controls a magnetic resonance apparatus, cause the computer to implement any or all embodiments of the method according to the invention, as described above.

The advantages and embodiments specified in relation to the method also apply analogously to the magnetic resonance apparatus and the electronically readable data storage medium.

DESCRIPTION OF THE PREFERRED EMBODIMENTS

Figure 1:
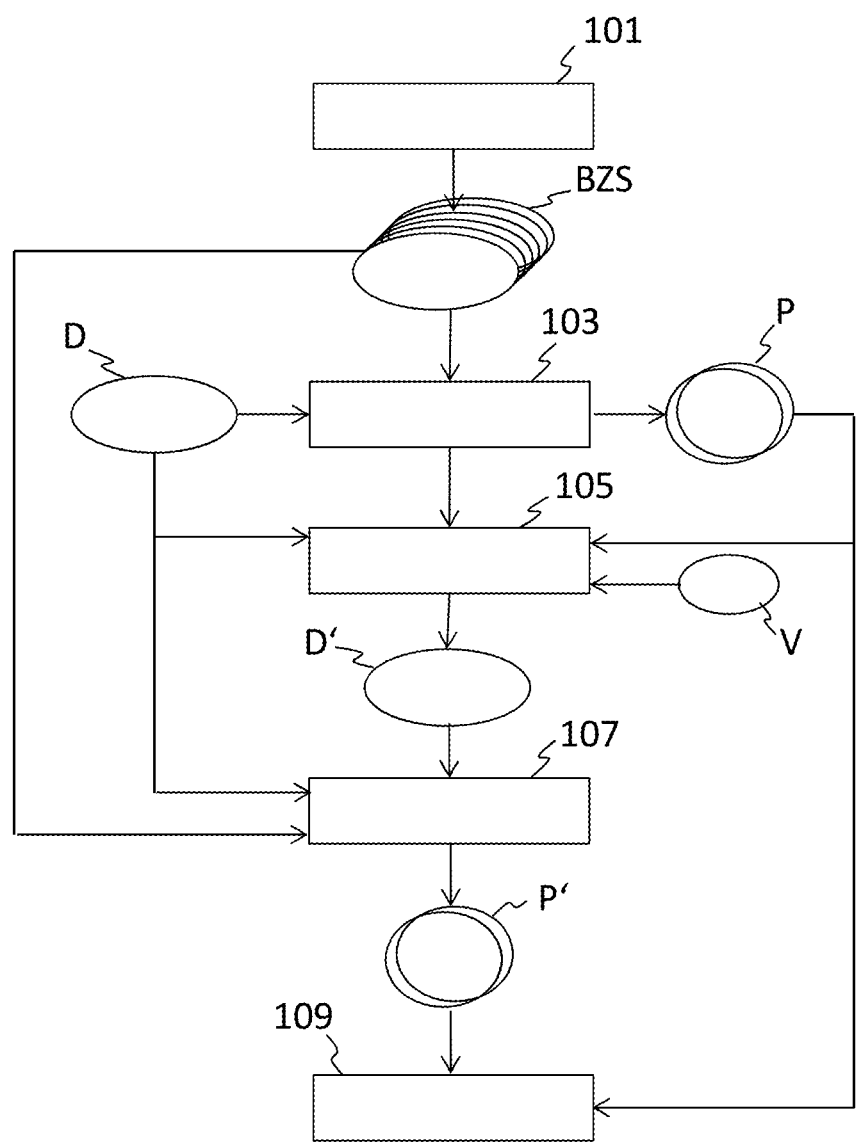
FIG. 1 is a flowchart of the method according to the invention.

FIG. 1 is a flowchart of the method according to the invention for determining parameter values in voxels of an examination object using a magnetic resonance fingerprinting (MRF) technique.

Here, at least one voxel time series BZS is crated with the use of an MRF method, from which a respective value (P, P') of at least one parameter at the location of the examination object represented in the respective voxel is to be determined (block 101). Here, the voxel time series BZS are established in particular such that the measured signal characteristics of the voxel time series display dependences on the parameters to be determined, that is to say that a change in a value of a parameter to be determined would bring about a change in at least some of the signals measured in the characteristic.

A first signal comparison of at least one segment of the respective signal characteristic of the established voxel time series BZS with a corresponding segment of first comparison signal characteristics D is performed in order to determine the respective values P of at least a first one of the parameters to be determined (block 103).

During the first signal comparison, at least one, in particular all, of the parameters from the group of parameters including the basic magnetic field B0, the emission field B1, the transverse relaxation T2 and the longitudinal relaxation T1 may for example be determined.

For this purpose, the method may be used for example in the context of the MRF method for simultaneously determining T1, T2, B1 and B0, in which the values of the parameters B1+, B0, T1 and T2 are identified in a single continuous measurement at each voxel. An example of a possible capture scheme for an MRF method of this kind will be explained below with reference to FIG. 2. In the capture scheme illustrated, among other things TrueFISP-type sequence components are used, since these are characterized by high signal efficiency and good coding of the B0 parameter.

Further comparison signal characteristics are generated on the basis of the first comparison signal characteristics D and values P that were determined in the first signal comparison (block 105).

Here, generation of the further comparison signal characteristics D' can include summing first comparison signal characteristics, in each case for values of a first further parameter, over a respective number of predetermined assumed possible variations (V) on the value of the first parameter in the respective voxel that was determined in the first signal comparison.

Here, the predetermined assumed possible variations may be predetermined on the basis of prior knowledge of the investigated object.

For example, in the first signal comparison the value of the longitudinal relaxation T1 or the value of the transverse relaxation T2 can be determined, and a first further parameter may be the longitudinal relaxation T1 or transverse relaxation T2, and a second further parameter a ratio between the longitudinal and transverse relaxation. Here, on the basis of prior knowledge of tissue types in the examination object and typical ratios of parameters thereof, for example longitudinal to transverse relaxation T1/T2, the ratios T1/T2 that are possible with the tissue types present may be predetermined as assumed possible variations. The further comparison signal characteristics that are generated may thus, as a synthetic dimension, vary the possible ratios T1/T2, where the value of either T1 or T2 has already been determined by the first signal comparison. If, in the further signal comparison, the value of T1 or T2 is simultaneously determined as the first further parameter, then the result may be improved, where appropriate also iteratively. Once the further signal comparison has determined a "best match" and thus a value for the ratio T1/T2 and a value for T1 or T2, then the value of the other parameter, T2 or T1, has also been determined.

It is thus possible, for example during the first signal comparison, to determine the value of the longitudinal relaxation T1, and for a first further parameter and a second further parameter to be the transverse relaxation T2 and a ratio between the longitudinal and transverse relaxation.

It is also possible, for example during the first signal comparison, to determine the value of the transverse relaxation T2, and for a first further parameter and a second further parameter to be the longitudinal relaxation T1 and a ratio between the longitudinal and transverse relaxation.

It is furthermore also possible, for example during the first signal comparison, to determine the value of the transverse relaxation T2, and for a first further parameter and a second further parameter to be the transverse relaxation T2 and a ratio between the longitudinal and transverse relaxation. In this case, a value for the longitudinal relaxation T1 can also be found from the determined values for T2 and the ratio between the longitudinal and transverse relaxation.

Furthermore, it is also possible, for example during the first signal comparison, to determine the value of the longitudinal relaxation T1, and for a first further parameter and a second further parameter to be the longitudinal relaxation T1 and a ratio between the longitudinal and transverse relaxation. In this case, a value for the transverse relaxation T2 can also be found from the determined values for T1 and the ratio between the longitudinal and transverse relaxation.

In addition or as an alternative, the predetermined assumed possible variations may correspond to statistical distributions whereof the number corresponds to a number of different possible assumed widths of the statistical distributions. This is primarily useful when a second further parameter has a dependence on the first parameter whereof the determined value forms the basis for generating the further comparison signal characteristics D', since in this way an effect of the first parameter on the second further parameter, produced by the said dependence, can be investigated.

The further comparison signal characteristics D' may be identified for example by summing first comparison signal characteristics D. This may be done in particular in each case for comparison signal characteristics D that correspond to a fixed value of a first further parameter, for example a value of T2, wherein, of these comparison signal characteristics D of a fixed value of a first further parameter, the ones whereof the value of the first parameter lies within a value range that is predetermined by the determined value of the first parameter and the respective width of the statistical distribution are summed. In this case, the value of the first parameter that was determined in the first signal comparison may for example lie centrally in the respective width. The respective summing may further include weighting in accordance with the statistical distribution. So comparison signal characteristics D to be summed are summed such that weighting is in accordance with the statistical distribution.

Here, statistical distributions may be Gaussian or Lorentz distributions or indeed a uniform distribution, etc. The distribution that is suitable may be selected for example by experiment or in accordance with an evaluation based on prior knowledge of the relationships between the different parameters.

During the first signal comparison, the value of the local basic magnetic field B0 may for example be determined, and a first further parameter may be the transverse relaxation T2, and a second further parameter may be a parameter dependent on the phase dispersion prevailing in the voxel, in particular the phase dispersion itself, the transverse relaxation T2' caused by variations in the basic magnetic field, or the effective transverse relaxation T2*, or one of the reciprocals thereof.

For example, predetermined assumed possible variations may thus be different widths of a statistical distribution that is centered about the value determined in the first signal comparison, for example the basic magnetic field B0. A value of a width of this kind that prevails in the voxel, determined by the further signal comparison, corresponds to a phase dispersion (off-resonance effects) in the voxel.

The local value of the decay of the transverse magnetization T2' caused by the local variation in the basic magnetic field may be described by way of a value of a width of this kind prevailing in the voxel that is determined by the further signal comparison, because the reciprocal of the decay of the transverse magnetization caused by local variations in the basic magnetic field is proportional to the said width specified for example as a full width at half maximum FWHM:

$$\frac{1}{T2'} \sim FWHM.$$

In each case, a further signal comparison is performed of at least one segment of the respective signal characteristic of the identified voxel time series BZS with a corresponding segment of the further comparison signal characteristics D' generated in block 105, in order to determine respectively the values of at least a first and a second further parameter P' of the parameters to be determined (block 107).

As a result of simultaneously determining the values of the first and the second further parameter by means of the further signal comparison using the generated comparison signal characteristics, which to a certain extent form a sub-directory, the values of the first and the second further parameter are integrally determined, as a result of which falsifications of the values of the one further parameter by (previously unknown) values of the other further parameter can be avoided.

The values P and P' of the parameters to be determined, which are determined for a respective voxel, may for example be output in the form of parameter cards, or for example stored for later use.

Thus, the described method may be used for example to minimize falsifications of MRF parameter cards that are caused for example by (T2*) phase dispersion. Hence, in generating the voxel time series, it is also possible to use sequence types whereof the signal response is influenced by T2* effects—as is the case for example in the TrueFISP sequence—that generate signals that are markedly dependent on such off-resonance effects within stop bands (or dark bands), which may for example result in erroneous T2 values. The method may thus be used with any MRF capture scheme in which the sequence types used display a time-variable T2* dependence of the signal.

For the purpose of avoiding falsifications of parameter cards by phase dispersion effects, the method may, for example in a first signal comparison (block 103), determine the value of the basic magnetic field B0 and where appropriate furthermore the values of the parameters T1, T2 and B1, wherein the first comparison signal characteristics D each include a dimension for the parameters whereof the values were determined in the first signal comparison, but do not include a dimension for the parameter of phase dispersion. Since it is known that the influence of phase dispersion on determining the values of the parameters T1, B0 and B1 from an MRF signal comparison is small (cf. the cited article by Chiu et al.), the values determined for these parameters may be retained hereafter. In a further signal comparison (block 107), the values of the parameters T2 may be determined (more precisely) and the phase dispersion may be determined (for the first time) as independent parameters, using further comparison signal characteristics that are generated specifically for this purpose (block 105). The further comparison signal characteristics D' are generated (block 105) such that they (like the first comparison signal characteristics D earlier) include a separate dimension for the first further parameter, in this case T2, and take account of possible changes to the signal by a changed second further parameter, in this case a changed phase dispersion. For this purpose, when the further comparison signal characteristics D' are generated, a sub-dictionary that represents a signal change resulting from phase dispersion can be calculated for each voxel in that, for example for each value of the T2 dimension, the first comparison signal characteristics are summed, weighted in the B0 dimension, which gives comparison signal characteristics that correspond approximately to comparison signal characteristics that would result from the precession of spins at different frequencies. The weighting results for example from an assumed distribution (e.g. Gaussian, Lorentz, uniform distribution, etc.) of the off resonances within the voxel. Here, the distribution is in particular centered about the central frequency of the respective B0 value that was determined in the first signal comparison. Different widths of the distribution result in the signal characteristics for different (intra-voxel) phase dispersion values, which can thus be taken into account when the parameter values are determined.

The method described here can also be used as a part step in an MRF method having a number of signal comparisons of the established voxel time series with comparison signal characteristics for the stepwise determination of parameter values.

Figure 2:
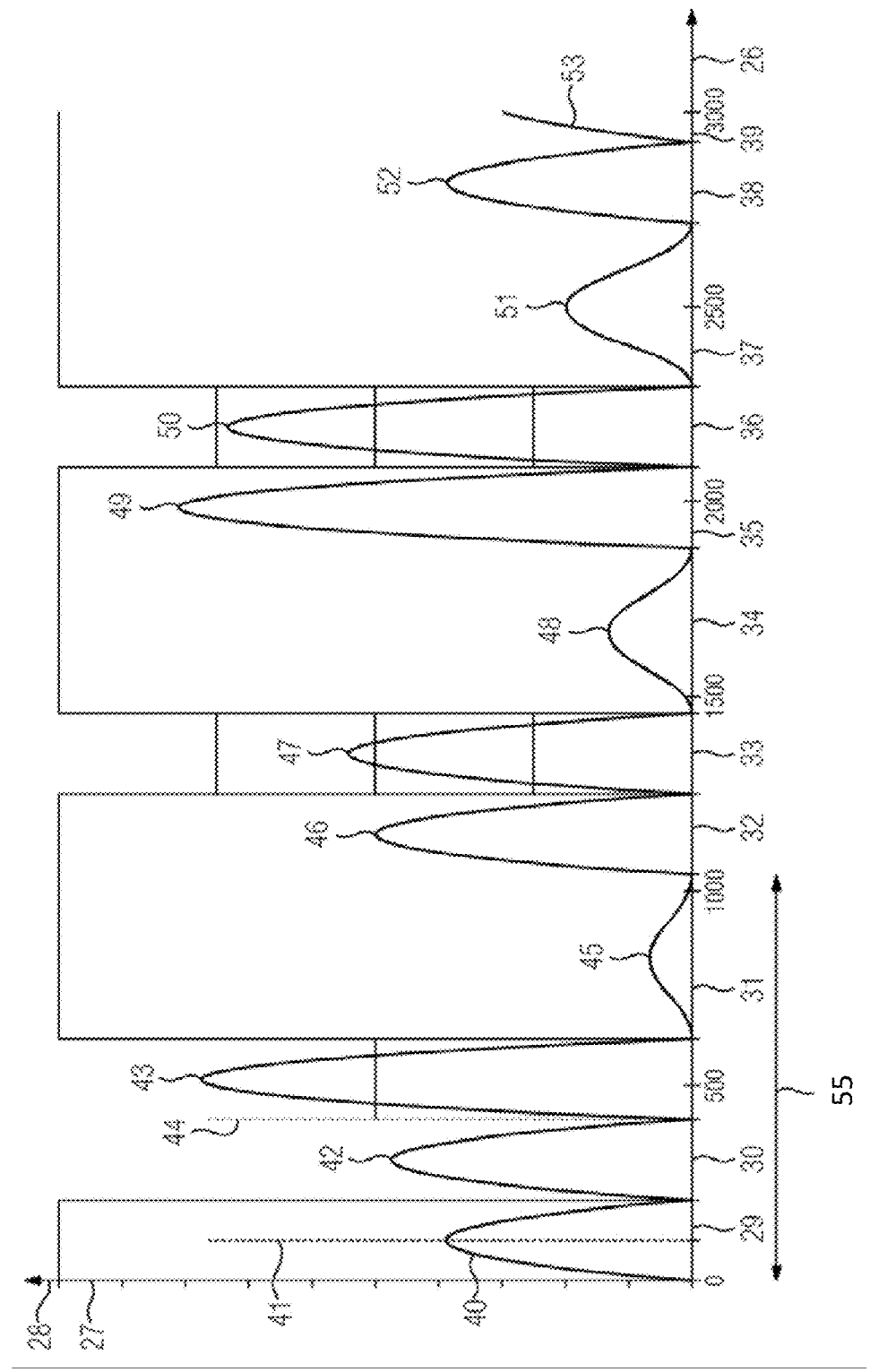
FIG. 2 shows a possible capture scheme for a voxel time series in accordance with the invention.

FIG. 2 shows schematically a capture method for capturing at least one voxel time series, as it can be used for the method according to the invention. The example illustrated shows a capture method for establishing voxel time series, in which three different sequence types are used, from the group of sequence types TrueFISP (true fast imaging with steady-state free precession), FISP (fast imaging with steady-state free precession) and FLASH (fast low-angle shot). The properties of the sequence types refer in particular to the sensitivity of the respective sequence types to variation in tissue-specific and/or measurement-specific parameters. For example, a FISP sequence has little sensitivity to variations in the basic magnetic field B0, whereas a trueFISP sequence is more sensitive to variations in the basic magnetic field B0. FLASH sequences and FISP sequences are sensitive to local variations in a radiated radio-frequency field B1+.

In the example illustrated in FIG. 2, the respective serial numbers of captured image data sets in the time series are indicated on the axis 26, and different variables are indicated on the axis 27. As the first variable, the flip angle in ° from 0° at the origin to 90° at the axis point 28 is indicated. In the example illustrated, the axis 26 runs from image data set 1 to image data set 3000.

The 3000 image data sets are distributed over twelve segments 29, 30, 31, 32, 33, 34, 35, 36, 37, 38 and 39.

In the first segment 29, the flip angle that was used during capture is indicated by way of the curve 40 for two hundred image data sets, wherein a FISP sequence can be used for the capture in segment 29. As described in relation to FIG. 1, once an RF excitation pulse has been applied with a particular flip angle, a complete image data set is captured, and then the next RF excitation pulse with the next flip angle is applied and a further image data set is captured. In segment 29, FIG. 2 shows a flip angle distribution corresponding to a sin² half curve. The maximum flip angle may be for example 24°, and constant phases can be used.

Solely as an example, a line 41 is plotted for the hundredth image data set. The corresponding flip angle is the maximum flip angle of the curve 40.

In the second segment 30, in the example illustrated four hundred image data sets are acquired using a different sequence type, for example a TrueFISP sequence. In this case, flip angles according to the curves 42 and 43 are used. In the case of the curve 42 these reach 45°, and in the case of the curve 43 72°.

Also only as an example, for the segment 30 a line 44 is once again plotted for the flip angle for the four hundredth image data set. In this case the flip angle is 1°.

A particular feature in the segment 30 is the use of two different phase cycles. On passing through the flip angles of the curve 42 a 00 phase cycle, or no phase cycle, is used, and on passing through the curve 43 a phase cycle of 180° is used. A 00 phase cycle indicates a fixed phase.

In the next segment 31, in the curve 45 the flip angles are indicated for the capture of four hundred fifty image data sets using a further sequence type, for example a FLASH sequence. These are smaller than in the FISP or TrueFISP sequence, and reach 6°. Their distribution is also a sin² distribution.

In addition to varying the flip angles, as the FLASH sequence is repeated, a phase cycle is applied for the purpose of producing RF spoiling. This increases the phase by multiples of 117°, as described.

The sequence of the different sequence types used in the segments 29, 30 and 31 together forms a block 55. This is used a total of three times in FIG. 2. Here, reference is solely to the type of sequence and not to the number of image data sets or the flip angle curve.

In the segment 32, 200 image data sets are once again captured using the first sequence type of the block 55, that is, for example, a FISP sequence. As in segment 29, the phase is constant, but the maximum flip angle is 45°. The flip angles used lie on the curve 46.

This is followed in segment 33 by 200 image data sets that are to be acquired using the second sequence type of the block 55—for example a TrueFISP sequence. Here, a 90° phase cycle is used and the maximum flip angle is 50°. The flip angles are indicated on the curve 47.

The next approximately 450 image data sets, in segment 34, are to be captured, as in segment 31, using the third sequence type of the block 55—for example a FLASH sequence. The curve 48 exhibits a sin² distribution with a maximum value of 14°.

Curve 49 in segment 35 reaches 72° and shows the flip angles of the radio-frequency pulse 19 the third time the first sequence type of the block 55 is used—for example a FISP sequence. In this pass too, the phase is constant.

On acquiring a further two hundred image data sets with the second sequence type of the block 55—for example a TrueFISP sequence—a 270° phase cycle is used. The flip angles plotted in the curve 50 in segment 36 reach 65°.

The next approximately 450 image data sets in segment 37 are captured using the third sequence type of the block 55—for example the FLASH sequence. The curve 51 displays a flip angle curve extending to at most 20°, once again in a sin² distribution.

In the last segment 38 there are two curves 52 and 53 for capturing image data sets with the first sequence type of the block 55—for example a FISP sequence. These once again represent flip angle curves. As above in the preceding segments, a constant phase is for example used in capturing the measurement data with a FISP sequence.

Through its presentation in segments of different sequence types with different sensitivities, the example illustrated allows a plurality of tissue-specific and measurement-specific parameters to be determined in a matching step; in particular, the parameters T1, T2 and B0 and B1+ can be determined. However, the illustrated example should not be considered restrictive. In principle, a voxel time series may also be established with the use of only one sequence type. The use of a plurality of different sequence types of different properties, in particular with reference to the respective sensitivities to tissue-specific and/or measurement-specific parameters, however, increases the number of parameters that may be determined from a voxel time series captured in this way, and/or the quality of the determined values of parameters in a manner corresponding to the properties of the sequence types used.

The illustrated numbers of image data sets that are captured with one sequence type, and the flip angle curves shown, should also only be seen as examples.

In FIG. 2, to illustrate a compensation process, spatial distributions of particular basic magnetic field values B0 are shown in an examination object as an example. During the recording of the measurement data, from which the image data has been reconstructed, the signal characteristics of which per voxel should be compared as voxel time series with comparison signal characteristics in order to determine at least the local values of the basic magnetic field B0, a linear characteristic of the basic field magnet B0 "from top to bottom" is generated in the examination object to clarify the effect.

The spatially resolved distribution of basic magnetic field values (B0 map) in an examination object, shown on the left, corresponds to the basic magnetic field values determined voxel-by-voxel by a signal comparison of voxel time series with comparison signal characteristics, wherein the comparison signal characteristics used for the signal comparison are comparison signal characteristics of a dictionary, the comparison signal characteristics of which cover a smaller B0 value range than B0 values which occur in the examination object. The B0 map shown on the left thus covers e.g. B0 values in a range from −40 to +40, predetermined by the type of recording of the measurement data underlying the voxel time series and the corresponding comparison signal characteristics (the dictionary), in any desired units.

The difference B0 map shown in the center corresponds to a difference image of the B0 map shown on the left with a B0 map with rough spatial resolution, which consists of B0 values derived from particular B0-sensitive sections of the voxel time series, and thus covers B0 values in infinitesimally small steps. The roughly resolved B0 map may, for example, be determined from sections of the voxel time series, in which the measurement data has been recorded with a sequence type with properties of a FISP sequence, by determining the phase differences of the signals in said sections of the voxel time series, which have been recorded at different echo times, possibly using a smoothing operation.

If the difference B0 map of said roughly spatially resolved B0 map and the B0 map created by signal comparison, shown on the left, are rounded to multiples of 1/TR, this results in segments which correspond to multiples of 1·TR (in the example shown, five of such segments can be identified). If the result of said rounding is subtracted from the B0 map subject to artifacts (left), a compensated, deconvolved B0 map is obtained, as shown on the right. The B0 map, shown on the right, is a good representation of the linear characteristic of the basic magnetic field B0 artificially generated during the measurement, even by the described processing with the rough B0 map in a larger value range, in the example shown in a range from −200 to +200 in the same units as in the B0 map shown on the left.

Here, use is made of the fact that compensation data can already be obtained from the signals of the voxel time series used without a signal comparison, e.g. by at least roughly resolved determination of local values of a parameter to be determined, in particular of a measurement-specific parameter, such as the basic magnetic field B0, which compensation data can be used for compensation, e.g. deconvoluting parameter values determined by means of signal comparison. Although the resolution of such a roughly resolved parameter map is not directly sufficient as a result of a local distribution of the parameter values, the parameter values of the roughly resolved parameter map can be used as compensation data in order to compensate for more highly resolved parameter maps, which have been determined by signal comparison, for example to deconvolute as in the example described above.

Thus, in the high resolution of the created voxel time series, compensated values of the parameters determined for the voxel time series are determined which can improve previously determined values of the respective parameter and thus compensate for artifacts, wherein even the range of values which can be achieved when determining the compensated parameter values can be enlarged compared to the range of values which can be achieved with a pure signal comparison.

With an MRF recording method which makes it possible to determine the parameters T1, T2, B0 and B1+, an exemplary possible sequence of a method according to the invention for determining the local parameter values of the parameters T1, T2, B0 and B1 with a multi-level determination of the local parameters could appear as follows.

After a first signal comparison between the established voxel time series and comparison signal characteristics, in which in particular the entire signal characteristic of the voxel time series is compared with the respective entire characteristic of the comparison signal characteristics, local values (cards) for all the parameters T1, T2, B0 and B1+ can be determined.

Figure 3:
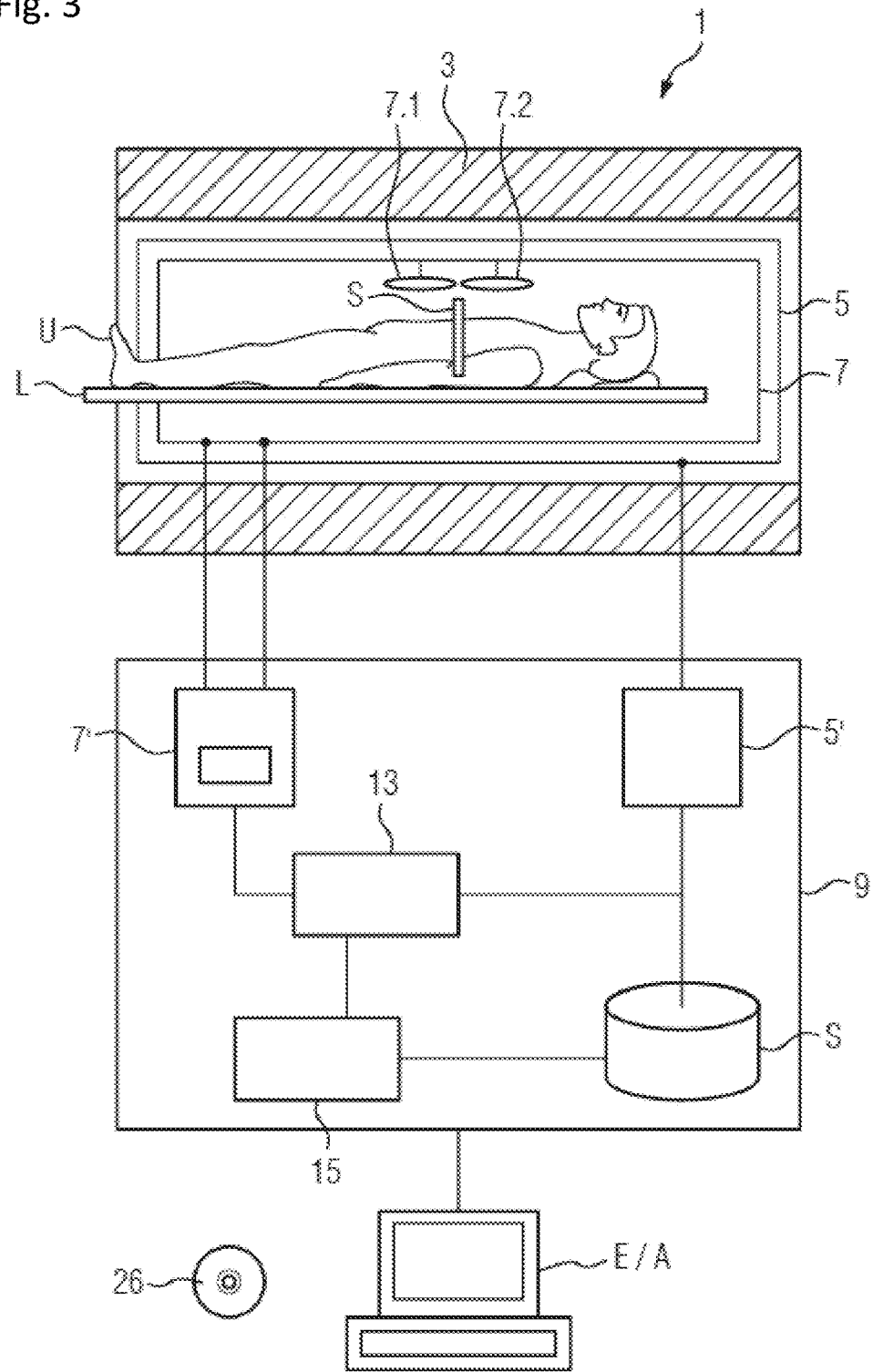
FIG. 3 schematically illustrates a magnetic resonance apparatus according to the invention.

FIG. 3 schematically illustrates a magnetic resonance apparatus according to the invention. This includes an MR data acquisition scanner 1 that has a basic field magnet 3 that generates the basic magnetic field, a gradient unit 5 that generates the gradient fields, a radio-frequency unit 7 for emitting and receiving radio-frequency signals. A control computer 9 is configured to perform the method according to the invention. In FIG. 3, these units of the scanner 1 are only illustrated in a rough schematic manner. In particular, the radio-frequency unit 7 may have multiple sub-units, for example a number of RF coils such as the schematically shown local coils 7.1 and 7.2, or more coils, which may be designed and operated either only for emitting radio-frequency signals or only for receiving the triggered radio-frequency (MR) signals, or for both.

For the purpose of investigating an examination object U, for example a patient or indeed a phantom, the object may be introduced into the measurement volume of the scanner 1 on a table L. The slice S represents an exemplary target volume of the examination object U from which measurement data are to be captured.

The control computer 9 serves to control the magnetic resonance system, and may control the gradient unit 5 via a gradient controller 5', and the radio-frequency unit 7 via a radio-frequency emitting/receiving controller 7'. The radio-frequency unit 7 may in this case include a number of channels via which signals may be individually emitted or received.

Together with its radio-frequency emitting/receiving controller 7', the radio-frequency unit 7 is responsible for generating and radiating (emitting) a radio-frequency alternating field for the purpose of manipulating the spins in a region to be manipulated (for example in slices S to be measured) of the examination object U. For this purpose, the center frequency of the radio-frequency alternating field, which is also designated the B1 field, is to the greatest possible extent set such that it lies close to the resonant frequency of the spins to be manipulated. Deviations in the center frequency from the resonant frequency are called off-resonance. To generate the B1 field, currents that are controlled using the radio-frequency emitting/receiving controller 7' are applied to the RF coils in the radio-frequency unit 7.

Furthermore, the control computer 9 includes a parameter value determining processor 15, by which signal comparisons according to the invention are performed in order to determine parameter values. The control computer 9 as a whole is designed to perform the method according to the invention.

A central processor 13 in the control computer 9 performs all the processing operations that are needed for the required measurements and determinations. Results and interim results that are required for this purpose or identified during this can be stored in a memory M of the control computer 9. The illustrated units should not necessarily be understood as physically separated units but merely represent a subdivision into meaningful functions, which may also be implemented in fewer or indeed even in only one physical unit.

Control commands may be sent to the magnetic resonance apparatus and/or results such as image data may be displayed on the control computer 9 via an input/output device E/A of the magnetic resonance apparatus 1, for example by a user.

The method described herein may be provided in the form of a computer program product that includes program code and implements the described method in the control computer 9. A non-transitory, electronically readable data storage medium 26 has electronically readable control information (program code) stored thereon. When the data medium 26 is loaded into the control computer 9, the program code cause the control computer 9 to perform the described method.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for determining parameter values in voxels of an examination object using magnetic resonance fingerprinting (MRF), comprising:

providing a computer with an MRF image, comprised of voxels and, in said computer, creating at least one voxel time series from which a respective value of at least one first parameter at a location in the examination object represented by the respective voxel is to be determined;

in said computer, performing a first signal comparison of at least one segment of a respective signal characteristic of the voxel time series with a corresponding segment of first comparison signal characteristics, in order to determine respective values of the at least one first parameter to be determined;

in said computer, generating further comparison signal characteristics on the basis of the first comparison signal characteristics and values determined in the first signal comparison;

in said computer, performing a second signal comparison of at least one segment of the respective signal characteristic of the established voxel time series with a corresponding segment of the generated further comparison signal characteristics, in order to determine the respective value of at least one first further parameter and the respective value of at least one second further parameter of the parameters to be determined, wherein at least one of the first further parameter and the second further parameter is the same as the first parameter of the first signal comparison, and therefore the value of this first parameter determined in the first signal comparison is redetermined in the second signal comparison, and wherein at least one of another of the first further parameter and the second further parameter is different than the first parameter of the first signal comparison, and therefore the respective value of the other of the at least one of the at least one first further parameter and the at least one second further parameter has not been determined in the first signal comparison; and from said computer, providing an output representing the values determined for the respective voxel of the parameters to be determined.

2. The method as claimed in claim 1, comprising creating the voxel time series so that the signal characteristics of the voxel time series exhibit dependences on the at least one first parameter, the at least one first further parameter, and the at least one second further parameter to be determined.

3. The method as claimed in claim 1, wherein the at least one second further parameter has an influence on the at least one first further parameter.

4. The method as claimed in claim 1, wherein the at least one second further parameter has a dependence on the at least one first parameter whereof the determined at least one first parameter forms the basis for generating the further comparison signal characteristics.

5. The method as claimed in claim 1, wherein values determined during a first signal comparison of parameters that exhibit no dependence on the at least one second further parameter are not determined again during a further signal comparison.

6. The method as claimed in claim 1, comprising generating the further comparison signal characteristics by summing first comparison signal characteristics, for values of the first further parameter, over a respective number of predetermined assumed possible variations of the value of the at least one first parameter in the respective voxel that was determined in the first comparison signal characteristics.

7. The method as claimed in claim 6, comprising predetermining assumed possible variations based on prior knowledge of the investigated object.

8. The method as claimed in claim 6, wherein the predetermined assumed possible variations correspond to statistical distributions wherein the number corresponds to a number of different possible assumed widths.

9. The method as claimed in claim 1, wherein said MRF image is acquired using a scanner that produces a basic magnetic field and an RF emission field, and wherein said MRF image represents one of transverse relaxation or longitudinal relaxation of nuclear spins of the examination object that were excited by said RF emission field, and comprising, during the first signal comparison, determining at least one of the at least one first parameter, the at least one first further parameter, and the at least one second further parameter of the parameters from the group consisting of the basic magnetic field, the RF emission field, the transverse relaxation, and the longitudinal relaxation.

10. The method as claimed in claim 1, wherein said MRF image is acquired using a scanner that produces a basic magnetic field and an RF emission field, and wherein said MRF image represents one of transverse relaxation or longitudinal relaxation of nuclear spins of the examination object that were excited by said RF emission field, and comprising, during the first signal comparison, determining a value of the local value of said basic magnetic field, and the at least one first further parameter is a transverse relaxation T2 of said transverse relaxation, and the at least one second further parameter is a parameter dependent on a phase dispersion prevailing in the respective voxel.

11. The method as claimed in claim 1, wherein said MRF image is acquired using a scanner that produces a basic magnetic field and an RF emission field, and wherein said MRF image represents one of transverse relaxation or longitudinal relaxation of nuclear spins of the examination object that were excited by said RF emission field, and comprising, during the first signal comparison, determining the value of the longitudinal relaxation T1 of said longitudinal relaxation or the value of the transverse relaxation T2 of said transverse relaxation, and the at least one first further parameter is the longitudinal relaxation T1 or transverse relaxation T2, and the at least one second further parameter is a ratio between the longitudinal and transverse relaxation.

12. The method as claimed in claim 1, comprising determining the value of the at least one second further parameter whereof the value is determined in a further signal comparison cannot be determined in the first signal comparison.

13. A magnetic resonance apparatus, comprising:

a magnetic resonance data acquisition scanner configured to operate so as to acquire a magnetic resonance fingerprinting (MRF) image of an examination object, said MRF image being comprised of voxels having respective parameter values;

a computer provided with said MRF image, said computer being configured to create at least one voxel time series from which a respective value of at least one first parameter at a location in the examination object represented by the respective voxel is to be determined;

said computer being configured to perform a first signal comparison of at least one segment of a respective signal characteristic of the voxel time series with a corresponding segment of first comparison signal characteristics, in order to determine respective values of the at least one first parameter to be determined;

said computer being configured to generate further comparison signal characteristics on the basis of the first comparison signal characteristics and values determined in the first signal comparison;

said computer being configured to perform a further signal comparison of at least one segment of the respective signal characteristic of the established voxel time series with a corresponding segment of the generated further comparison signal characteristics, in order to determine the respective value of at least one first further parameter and the respective value of at least one second further parameter of the parameters to be determined, wherein at least one of the first further parameter and the second further parameter is the same as the first parameter of the first signal comparison, and therefore the value of this first parameter in the first signal comparison is redetermined in the further signal comparison, and wherein at least one of another of the first further parameter and the second further parameter is different than the first parameter of the first signal comparison, and therefore the respective value of the other of the at least one of the at least one first further parameter and the at least one second further parameter has not been determined in the first signal comparison; and said computer being configured to provide an output representing the values determined for the respective voxel of the parameters to be determined.

14. A non-transitory, computer-readable data storage medium encoded with programming instructions, said storage medium being loaded into a computer for determining parameter values in voxels of an examination subject using magnetic resonance fingerprinting (MRF), said programming instructions causing said computer to:

receive an MRF image, comprised of voxels, and create at least one voxel time series from which a respective value of at least one first parameter at a location in the examination object represented by the respective voxel is to be determined;

perform a first signal comparison of at least one segment of a respective signal characteristic of the voxel time series with a corresponding segment of first comparison signal characteristics, in order to determine respective values of the at least one first parameter to be determined;

generate further comparison signal characteristics on the basis of the first comparison signal characteristics and values determined in the first signal comparison;

perform a further signal comparison of at least one segment of the respective signal characteristic of the established voxel time series with a corresponding segment of the generated further comparison signal characteristics, in order to determine the respective value of at least one first further parameter and the respective value of at least one second further parameter of the parameters to be determined, wherein at least one of the first further parameter and the second further parameter is the same as the first parameter of the first signal comparison, and therefore the value of this first parameter determined in the first signal comparison is redetermined in the further signal comparison, wherein at least one of another of the first further parameter and the second further parameter is different than the first parameter of the first signal comparison, and therefore the respective value of the other of the at least one of the at least one first further parameter and the at least one second further parameter has not been determined in the first signal comparison; and provide an output representing the values determined for the respective voxel of the parameters to be determined.

\* \* \* \* \*